United States Patent [19]

Beasom et al.

[11] Patent Number: 4,929,568
[45] Date of Patent: May 29, 1990

[54] METHOD OF ISOLATING A TOP GATE OF A MESFET AND THE RESULTING DEVICE

[75] Inventors: James D. Beasom, Melb. Village, Fla.; William E. O'Mara, Jr., Kingston, N.H.

[73] Assignee: Harris Corporation, Melbourne, Fla.

[21] Appl. No.: 405,282

[22] Filed: Sep. 11, 1989

[51] Int. Cl.⁵ .......................................... H01L 21/265
[52] U.S. Cl. ...................................... 437/40; 437/176; 357/22
[58] Field of Search ................. 437/22, 41, 176, 912; 357/22 I, 22 F, 22 G, 22 J

[56] References Cited

U.S. PATENT DOCUMENTS

| | | |
|---|---|---|
| 3,722,079 | 3/1973 | Beasom . |
| 3,755,012 | 8/1973 | George et al. .................. 357/22 F |
| 4,185,291 | 1/1980 | Hirao et al. ..................... 357/22 F |
| 4,287,526 | 9/1981 | Sakuma ............................. 357/22 F |
| 4,456,918 | 6/1984 | Beasom . |
| 4,495,694 | 1/1985 | Beasom . |
| 4,546,539 | 10/1985 | Beasom ................................ 437/26 |

Primary Examiner—Brian E. Hearn
Assistant Examiner—Trung Dang
Attorney, Agent, or Firm—Barnes & Thornburg

[57] ABSTRACT

A MESFET including a Schottky top gate which extends across the channel region between the source and drain regions and beyond two opposed sides of the dielectric isolation onto the substrate in which the device is built. The portion of the top gate which extends across the channel is disconnected from the portion which extends across the substrate beyond the dielectric isolation. This may result from the removal of the gate material at the dielectric isolation or by the portion of the gate material which is on the dielectric isolation being vertically displaced and disconnected or discontinuous from the portion of the gate material which extends across the channel and that portion which extends across the substrate.

13 Claims, 3 Drawing Sheets

METHOD OF ISOLATING A TOP GATE OF A MESFET AND THE RESULTING DEVICE

BACKGROUND AND SUMMARY OF THE INVENTION

The present invention relates generally to metal Schottky junction field effect transistors (MESFET) and more specifically to an isolated top gate MESFET and a method of making.

MESFETs are junction field effect transistors in which at least one gate is formed by use of a Schottky barrier diode rather than by an PN junction diode. The performance of such devices can be improved when they are built such that the two gates are isolated from one another. This is particularly valuable in integrated circuit applications where one of the gates only weakly modulates the channel and has significant junction leakage and/or capacitance associated therewith. The weak, parasitic loaded gate may be connected to a non-sensitive circuit node, often the source, while the other gate is used as a device control gate thereby reducing the parasitics on the control gate.

Another advantage afforded by an isolated gate structure is that several devices can be built in a common bottom gate isolated island rather than in separate isolated islands. This saves die area and improves match of matched pairs by allowing the members of the pair to be closer to one another.

Isolated gate devices can also be used as four terminal devices in which the second gate is the fourth terminal. Such devices permit novel circuit implementations not possible with a three terminal device. An example is use of the second gate to apply an automatic gain control signal to a field effect transistor being used as an amplifier device.

Several prior art methods which form isolated top gate devices are known. One uses an insulator or semi-insulating support region under the channel to eliminate the second junction thereby transforming the bottom gate into an MOS gate. Another method uses a closed geometry top gate in which the top gate encloses at least one of the source and drain contact regions. The enclosed region or regions is then connected by a second level of interconnect. These methods are difficult and expensive to produce, thus there is a need for improved methods.

For PN junction field effect transistors having thin channel regions and top gate ohmic contact regions, special processing must be produced to provide an appropriate top gate on the contact region isolation as illustrated in U.S. Pat. Nos. 4,456,918 and 4,495,694 to Beasom.

In MESFETs having a rectangular Schottky barrier diode top gate on the channel between two non-concentric source and drain regions, the designer must terminate the width of the top of the Schottky metal spaced from the edge of the channel in order to Produce an isolated top gate. This separation is determined by the accuracy of forming the necessary apertures in the oxide such that it does not extend outside of the channel. The separation prevents the field effect transistor from being turned completely off and creates a parasitic field effect transistor having only a bottom gate which is in parallel with the main field effect transistor. This problem also occurs where the device is built in a dielectrically isolated island since the lateral dimension of the island varies because the manufacturing technique. Thus, although it creates an isolated top gate, it also produces a transistor which may not be applicable for all applications.

Thus, it is an object of the present invention to provide an isolated top gate MESFET which is capable of being turned completely off.

A further object of the present invention is to provide a method of forming an isolated top gate MESFET which can be turned completely off.

A still even further object of the present invention is to provide a method of forming an isolated top gate MESFET in a dielectrically isolated region island.

These and other objects of the invention are attained by using a Schottky top gate which extends across the channel region between the source and drain regions and beyond two opposed sides of the dielectric isolation onto the substrate in which the device is built. The portion of the top gate which extends across the channel is disconnected from the portion which extends across the substrate beyond the dielectric isolation. This may result from the removal of the gate material at the dielectric isolation or by the portion of the gate material which is on the dielectric isolation being vertically displaced and disconnected or discontinuous from the portion of the gate material which extends across the channel and that portion which extends across the substrate. The bottom gate also extends beyond the dielectric isolation below the surface of the island and intersects the bottom of the source and drain regions. The length of the Schottky barrier top gate and the bottom gate diffusion are sufficiently large so as to extend beyond the dielectric isolation for the maximum anticipated island size which results from the dielectric isolation process. Thus, the top and bottom gates completely define the channel and prevent any leakage current beyond the gates.

One method of forming a disconnection of the gate material between the portion extending across the channel and the portion extending across the substrate includes removing opposed portions of the dielectric isolation below the surface of the substrate. Applying a gate material on the top surface of the island extending across the channel and onto the substrate of a thickness small enough compared to the depth of the removed dielectric isolation to be disconnected at the dielectric isolation. Preferably, the width of the removed dielectric isolation is greater than the width of the top gate formed.

Another method of forming the disconnected top gate portion includes applying a top gate material whose silicide will form a Schottky barrier top gate with the channel, over the channel region, the dielectric isolation and the substrate and heating to alloy the gate material with the island and the substrate. The unalloyed portion of the gate material on the dielectric isolation is selectively removed to form a silicide Schottky barrier top gate with and extending totally across the channel and being discontinuous at the dielectric isolation from the silicide over the substrate.

Other objects, advantages and novel features of the present invention will become apparent from the following detailed description of the invention when considered in conjunction with the accompanying drawings

DETAILED DESCRIPTION OF THE DRAWINGS

Figure 1:
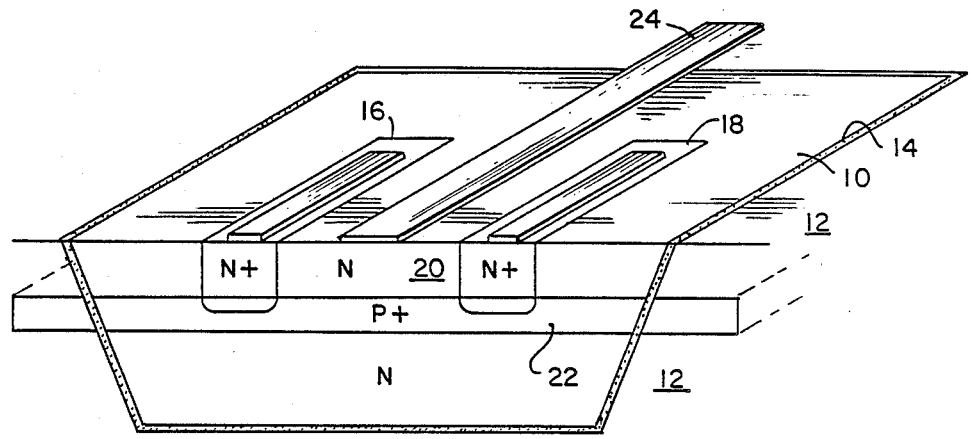
FIG. 1 is a cut-away perspective of a non-isolated top gate MESFET.
Figure 2:
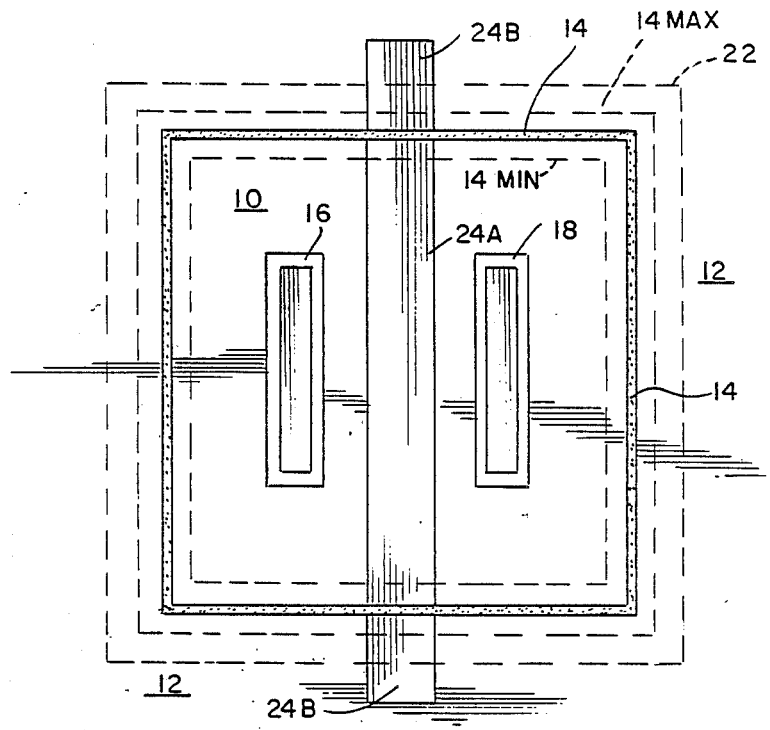
FIG. 2 is a plan view of the MESFET of FIG. 1 modified according to the principles of the present invention to provide an isolated top gate.
Figure 7:
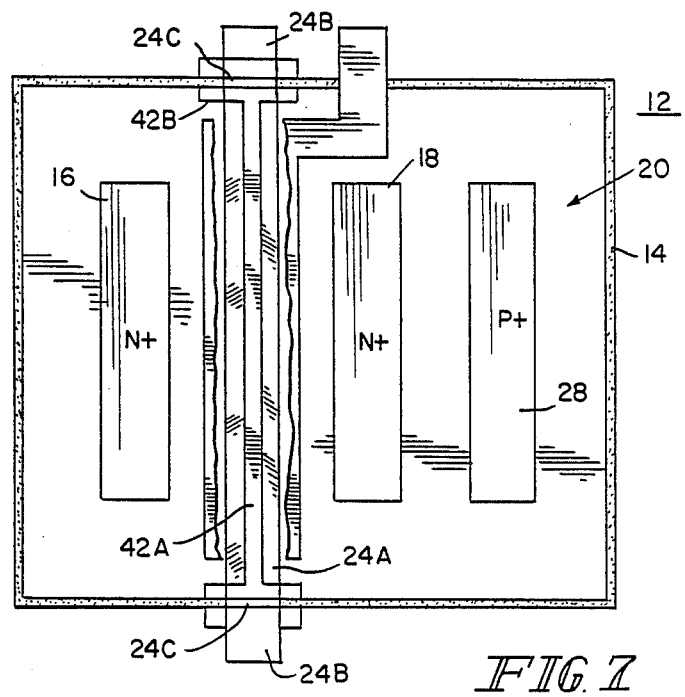
FIG. 7 is a plan view of a MESFET of FIG. 1, modified according to the principles of the present invention, to provide another isolated top gate.

A MESFET is shown in FIGS. 1, 2 and 7, as being formed in a semiconductor island 10 separated from a substrate 12 by dielectric isolation 14. For purposes of example, the island 10 has an N conductivity impurity type. N+ source and drain regions 16 and 18 are formed in the island 10 separated therefrom by portion 20 of the island 10 which forms the channel of the MESFET. A P+ bottom gate region 22 is formed in and below the surface of the island 10. The bottom gate 22 intersects the bottom of the source and drain regions 16 and 18 and extends outside the dielectric isolation 14. Thus, the bottom gate 22 defines the bottom of the channel region.

The top gate 24 is of a material which forms a Schottky barrier with the channel region 20. The gate material 24 could be selected from the group of two percent silicon doped aluminum, tungsten, platinum silicide, tungsten-silicide, etc. The top gate 24 extends across the channel region 20 and extending outside opposed sides of the dielectric isolation 14 onto the substrate 12. Thus, the gate extends across all possible width channel regions at the surface of the island 10 and prevents any leakage or parasitic devices.

The bottom or back gate 22 formed by the P+ implant is electrically floating in FIGS. 1 and 2. In many applications this is undesirable. Electrical connection can be achieved by adding a P region 28 which extends from the substrate surface down to and intersects the P+ bottom gate 22 as illustrated in FIG. 7. Separate contact can be made to the bottom gate through bottom gate contact region 28 and the top gate through top gate metal 24.

While the source and drain regions 16, 18 may be formed by diffusion, the bottom gate region 22 is formed by ion implantation. Preferably the bottom gate region of the ion implantation is formed after the source and drain regions so as to not be effected by the high temperature processing of the deposition and diffusion.

The present device is compatible with bipolar processing and requires very few additional steps. These steps would include the ion implantation for the bottom gate 22. The processing of the IC to form the dielectric isolation as well as preparing the island 10 for Schottky contacts is described in U.S. Pat. No. 4,260,431 to Piotrowski, which is incorporated herein by reference.

As is well known, the island size may vary between 14 min and 14 max as illustrated in FIG. 2. This variation results from the processing used to form the dielectric isolated islands 10. To assure that the top gate 24 and the bottom gate 22 extend out beyond the dielectric isolation 14, both have lateral dimensions which would exceed the anticipated maximum dielectric island dimensions 14 max.

In some situations, it is undesirable that the top gate 24 extends past the dielectric isolation and onto the polysilicon substrate 12. This results in undesirable connection of the polysilicon substrate 12 to the Schottky top gate 24 and would result in the connection of all gates in the integrated circuit together by the common connection to the polysilicon substrate 12. Also, it connects one side of each island's isolation capacitor to the top gate and results in a large capacitance load on the gate. The present invention offers at least two alternatives to avoid this undesirable connection of the Schottky barrier top gate 24 to the substrate 12 while assuring that the top gate extends totally across the channel 20 and to the dielectric isolated region 14.

As illustrated in FIG. 2, the top Schottky barrier gate 24 is divided into a section 24A extending completely across the channel between the source and drain regions 16 and 18 and to the dielectric isolation 14. The extended gate portions 24B extending over the island 12 are discontinuous or separated from the gate region 24A over the channel with no gate material being formed on the dielectric isolation region 14 between the gate portions 24A and 24B. The process described with respect to FIGS. 3-6 provides selective removal of the gate material only in the dielectric isolated region 14 and thereby assuring that the gate portion 24A extends totally across the channel region 20 and to the dielectric isolation 14. This process is not dependent upon the location of the dielectric isolated region 14 since the total gate material 24, including 24A and 24B, will always extend outside the maximum anticipated position or lateral extent of the dielectric isolated region 14.

Figure 3:
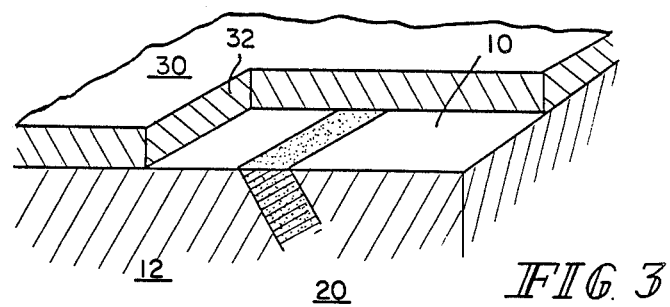
FIGS. 3-6 are cross-sectional perspectives at various stages of fabrication for forming the MESFET of FIG. 2 according to the principles of the present invention.
Figure 4:
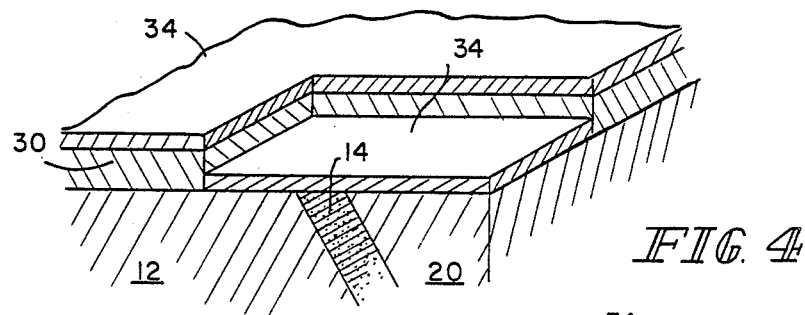

The process begins in FIG. 3 by forming an opening 32 in an insulative or mask layer 30. The island 20 is a single crystalline silicon separated from a polysilicon substrate 12 by a silicon dioxide layer 14. A material whose silicide will form a Schottky barrier with the single crystalline island 20 is applied as layer 34 lying over the substrate 12, the dielectric isolation 14, the silicon island 20 and the insulative layer 30 as illustrated in FIG. 4. The material 34 may be, for example, tungsten or platinum, or other well-known metals.

Figure 5:
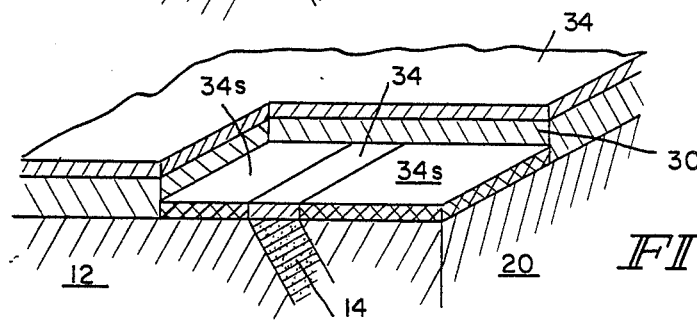

The wafer is then heated, and in the areas where the metal 34 is in contact with the silicon islands 20 and the polysilicon substrate 12, it forms a metal silicide 34S. The portions of the metal layer 34 which are on the dielectric isolation region 14 and the insulative layer 30 do not form a silicide and maintain their unalloyed state. A typical example for platinum would be to heat the substrate in the range of 500° to 700° C. for a period of 5 to 60 minutes. The resulting structure is illustrated in FIG. 5.

Figure 6:
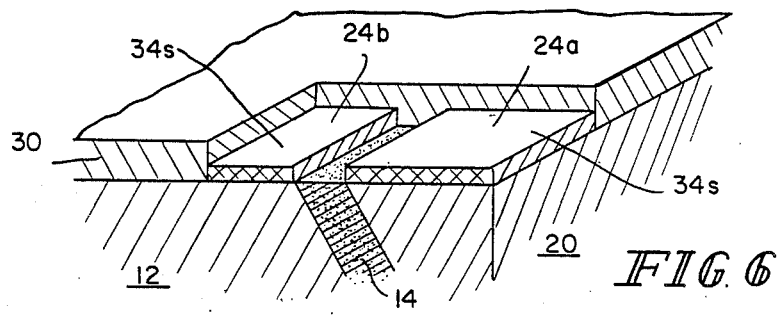

The metal layer 34 is selectively removed using an etchant, for example aqua riga. This leaves the silicide portions 34s which form the gate region 24A over the single crystalline silicon island 20 and the gate portion 24B over the substrate 12 and being discontinuous or disconnected over the dielectric isolation 14. The resulting structure is illustrated in FIG. 6 and FIG. 2.

Thus, it can be seen that the gate portion 24A extends totally across the channel and up to the edge of the dielectric isolation region 14. This allows the device to be turned completely off by assuring that the gate extends totally across the region to the dielectrically isolated region irrespective of variations in the location of the dielectric isolation 14. The discontinuity between the unused gate portion 24B from gate portion 24A provides a top gate 24A isolated from the substrate 12.

Another method of extending the top gate portion 24A across the total channel and separating it from the portion of the top gate 24B which extends across the substrate is to vertically displace an intermediate portion 24C, which is over the dielectric isolation region 14, from the portions 24A and 24B. This is illustrated in the plan view of FIG. 7. A first level metal conductor or interconnect 26 is shown connected to the top gate 24 and extending over the dielectric isolation at a point displaced from the point at which the top gate 24 extends across the dielectric isolation. The first level metal 26 is separated from the island 20 and the substrate 12 by a layer of insulation which is not shown. The first level metal 26 may also be used with the structure of FIG. 2.

It should also be noted that in FIG. 7 the top gate contact aperture 42A across a substantial portion of the channel is narrower than 42B at each end where it extends over the dielectric isolation 14 and adjacent portions of the island 20 and the substrate 12. This assures that the intermediate portion of the top gate 24C is discontinuous from the gate portion 24A and 24B.

Figure 8:
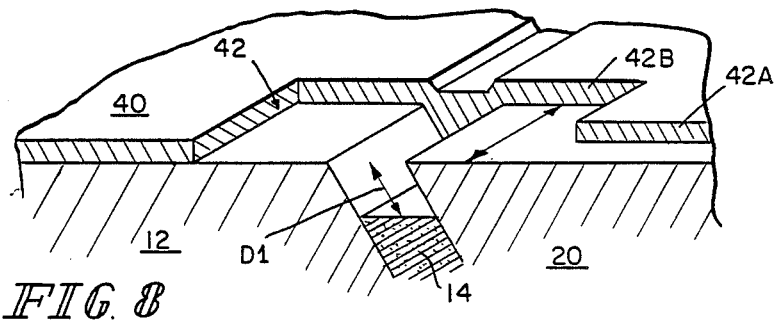
FIGS. 8 and 9 are perspective cross-sections at various stages of fabrication to form the MESFET of FIG. 7 according to the principles of the present invention.
Figure 9:
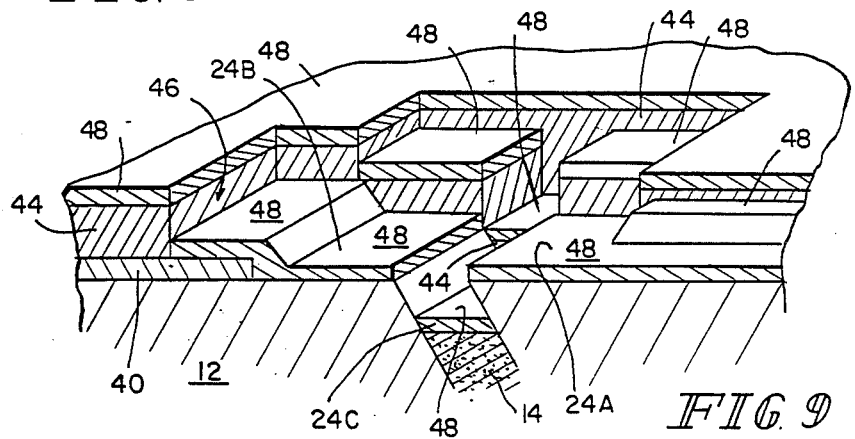

A method for fabricating the gate of FIG. 7 begins by forming the layer of dielectric isolation 40, for example silicon dioxide, on the surface of the wafer. A mask is formed and the dielectric isolation is removed to form the contact aperture 42A and 42B. The removal process, for example using an etchant 9:1 HF:H$_2$O, will selectively remove the insulative layer 40 and not the silicon island 20 or the polysilicon region 12. The etching process is continued to remove the exposed dielectric isolated region 14 down to a depth of D1. The mask material is removed resulting in the structure illustrated in FIG. 8. Next, a masking layer 44 is applied and an aperture 46 is formed therein which defines the width and length of the top gate 24. As can be seen from FIGS. 7-9, the top gate is wider than the contact aperture 42A over the substantial portion of the channel region, but narrower than the aperture 42B adjacent the dielectric isolation 14.

Next, a gate material, which forms a Schottky barrier with the silicon 20, is applied as layer 48. The thickness of the layer 48 is in the range of 100Å to 1000Å and is substantially smaller or less than 25% of the depth D1 of the removed dielectric isolation 14 which is in the range of 5000Å to 15,000Å. The material 48 may be, for example, selected from the group of PtSi$_{29}$W, WSi$_{29}$Al and applied by sputten deposition or E beam deposition. This process of application assures that there is a discontinuity between the portion 24C of the layer 48 which lies at the bottom of the opening formed in the dielectric isolation 14 from the portion 24A and 24B which lies in the aperture 42 of the field isolation 40. The mask layer 44 is then removed lifting off the portions of the material 48 thereon producing the gate structure 24A, 24B and 24C illustrated in FIG. 7. Thus, as in the other embodiments, a method is provided to assure that the gate metal 24A extends across the total width of the channel up to the dielectric isolated region 14 irrespective of variations in the location of the dielectric isolated region 14 while producing an isolated top gate.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A method of manufacturing an isolated top gate MESFET in an island of a first conductivity type isolated by dielectric isolation from a substrate comprising:
    forming source and drain regions of said first conductivity type spaced in said island to define a channel therebetween;
    forming a bottom gate region of a second conductivity type in and below the surface of said island;
    removing said dielectric isolation at two opposing portions of said dielectric isolation adjacent said channel to a first depth from said surface; and
    forming a top gate on said top surface of said island of a material which forms a Schottky barrier therewith and extends across a portion of said island forming said channel between said source and drain regions and beyond said two opposing portions of said dielectric isolation onto said substrate of a thickness small enough compared to said first depth to be disconnected at said dielectric isolation.

2. A method according to claim 1, wherein said bottom gate is formed to extend beyond said dielectric isolation into said substrate.

3. A method according to claim 2, wherein said bottom gate is formed to intersect said source and drain regions adjacent their bottoms.

4. A method according to claim 1, wherein said bottom gate is formed by ion implantation.

5. A method according to claim 1, wherein said top gate is formed to have a smaller width than the removed portion of said dielectric isolation.

6. A method according to claim 1, wherein said gate material is formed to be of a thickness of less than 25% of the first depth.

7. A method according to claim 1, including forming a gate interconnect contacting said top gate within said island and crossing said dielectric isolation laterally spaced from where the top gate is adjacent said dielectric isolation.

8. A method of manufacturing an isolated top gate MESFET in a silicon island of a first conductivity type isolated by dielectric isolation from a silicon substrate comprising:
    forming source and drain regions of said first conductivity type spaced in said island to define a channel therebetween;
    forming a bottom gate region of a second conductivity type in and below the surface of said island;
    forming a mask over said island and substrate having an aperture which extends across a portion of said island forming said channel between said source and drain regions and beyond two opposing sides of said dielectric isolation onto said substrate;
    forming a layer of gate material, whose silicide will form a Schottky barrier top gate with said channel, in said aperture;
    heating to alloy said material with said island and substrate; and
    selectively removing unalloyed portion of said material to form a Schottky barrier top gate with and extending totally across said channel and being discontinuous at said dielectric isolation.

9. A method according to claim 8, wherein said bottom gate is formed to extend beyond said dielectric isolation into said substrate.

10. A method according to claim 9, wherein said bottom gate is formed to intersect said source and drain regions adjacent their bottoms.

11. A method according to claim 8, wherein said bottom gate is formed by ion implantation.

12. A method according to claim 8, wherein said gate material is selected from the group of tungsten and platinum.

13. A method according to claim 8, including forming a gate interconnect contacting said top gate within said island and crossing said dielectric isolation laterally spaced from where the top gate is adjacent said dielectric isolation.

* * * * *